(12) United States Patent
Nagasato

(10) Patent No.: US 9,929,689 B2
(45) Date of Patent: Mar. 27, 2018

(54) SEMICONDUCTOR DEVICE

(71) Applicant: Rohm Co., Ltd., Kyoto (JP)

(72) Inventor: Masashi Nagasato, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/922,340

(22) Filed: Oct. 26, 2015

(65) Prior Publication Data

US 2016/0118961 A1 Apr. 28, 2016

(30) Foreign Application Priority Data

Oct. 27, 2014 (JP) .................................. 2014-218103

(51) Int. Cl.
| | |
|---|---|
| *H02P 27/04* | (2016.01) |
| *H03K 17/687* | (2006.01) |
| *H02M 1/34* | (2007.01) |
| *H01L 23/64* | (2006.01) |
| *H02M 3/158* | (2006.01) |
| *H02M 7/5387* | (2007.01) |

(52) U.S. Cl.
CPC .............. *H02P 27/04* (2013.01); *H01L 23/64* (2013.01); *H02M 1/34* (2013.01); *H03K 17/687* (2013.01); *H03K 17/6872* (2013.01); *H01L 2924/14* (2013.01); *H01L 2924/15311* (2013.01); *H01L 2924/15312* (2013.01); *H01L 2924/15313* (2013.01); *H01L 2924/19041* (2013.01); *H01L 2924/19042* (2013.01); *H01L 2924/19105* (2013.01); *H02M 3/158* (2013.01); *H02M 7/5387* (2013.01); *H02M 2001/348* (2013.01)

(58) Field of Classification Search
CPC .......................... H03K 17/687; H03K 17/6872
See application file for complete search history.

(56) References Cited

U.S. PATENT DOCUMENTS

| | | | | |
|---|---|---|---|---|
| 5,767,546 | A * | 6/1998 | Williams | ............ H01L 23/4824 257/343 |
| 2003/0042537 | A1* | 3/2003 | Nakamura | ............ H01L 29/402 257/328 |
| 2003/0047758 | A1* | 3/2003 | Nunokawa | .............. H01L 23/50 257/203 |
| 2004/0227547 | A1* | 11/2004 | Shiraishi | ............... H01L 23/495 327/110 |
| 2009/0091306 | A1* | 4/2009 | Hojo | .................... H01L 27/0823 323/273 |
| 2011/0024911 | A1* | 2/2011 | Shibuya | ................. G01R 27/14 257/773 |

FOREIGN PATENT DOCUMENTS

JP 2009-290841 12/2009

* cited by examiner

*Primary Examiner* — Shawki S Ismail
*Assistant Examiner* — Muhammad S Islam
(74) *Attorney, Agent, or Firm* — Fish & Richardson P.C.

(57) ABSTRACT

A semiconductor device disclosed in the present specification has a structure that includes: a first terminal that is to be externally connected to a power source line; a second terminal that is to be externally connected to a ground line; a third terminal that is internally connected to the first terminal and to be externally connected to a first terminal of a bypass capacitor; and a fourth terminal that is internally connected to the second terminal and to be externally connected to a second terminal of the bypass capacitor.

17 Claims, 8 Drawing Sheets

SEMICONDUCTOR DEVICE

CROSS-REFERENCE TO RELATED APPLICATIONS

This application is based on the following Japanese Patent Application, the contents of which are hereby incorporated by reference:

(1) Patent Application No.: 2014-218103 (the filing date: Oct. 27, 2014)

BACKGROUND OF THE INVENTION

1. Field of the Invention

The present invention relates to a semiconductor device to which a bypass capacitor is externally connected.

2. Description of Related Art

Conventionally, as a measure to curb a power source fluctuation of a semiconductor device, there is a case where a bypass capacitor is externally connected between a power source line and a ground line.

In the meantime, as an example of the prior art relevant to the above description, there is JP-A-2009-290841.

However, when a large current flows in the power source lone and the ground line, there is a case where influence of parasitic elements (parasitic inductance component and parasitic resistance component), which reside in the power source line and the ground line, becomes prevailing and it is impossible to sufficiently curb the power source fluctuation of the semiconductor device even if a bypass capacitor is used. Especially in an application whose power source voltage is low, there is a risk that even if a slight power source fluctuation occurs (power source fluctuation that can be neglected in an application whose power source voltage is high), the semiconductor device has trouble in operation.

SUMMARY OF THE INVENTION

In light of the above problems found by the inventor of the present application, it is an object of the present invention to provide a semiconductor device capable of effectively curbing a power source fluctuation and an electronic apparatus that uses the semiconductor device.

Accordingly, a semiconductor device disclosed in the present specification has a structure that includes: a first terminal that is to be externally connected to a power source line; a second terminal that is to be externally connected to a ground line; a third terminal that is internally connected to the first terminal and to be externally connected to a first terminal of a bypass capacitor; and a fourth terminal that is internally connected to the second terminal and to be externally connected to a second terminal of the bypass capacitor.

Other features, elements, steps, advantages, and characteristics of the present invention will become more apparent from the following detailed description of the best embodiments and the attached drawings.

DETAILED DESCRIPTION OF PREFERRED EMBODIMENTS

First Embodiment

Figure 1:
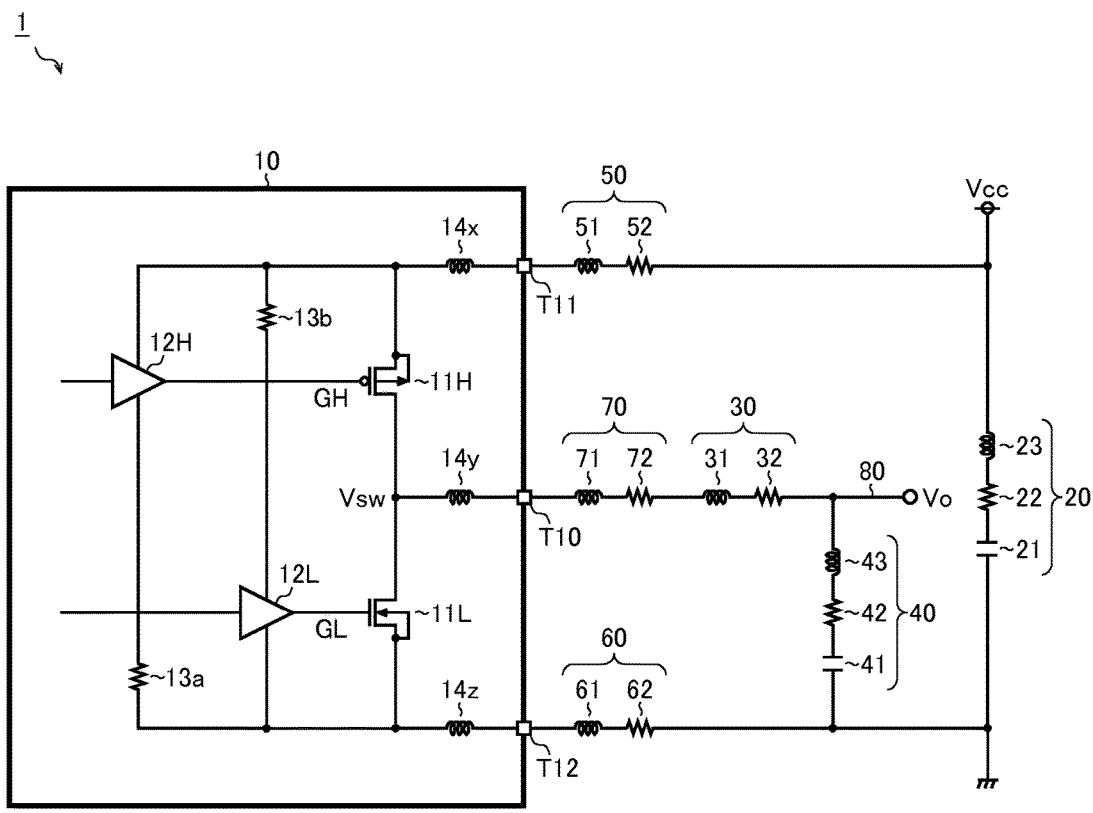
FIG. 1 is a circuit diagram showing a first embodiment of a switching power source device.

FIG. 1 is a circuit diagram showing a first embodiment of a switching power source device. The switching power source apparatus 1 of the present embodiment has a semiconductor device 10, and a various kinds of discrete components (bypass capacitor 20, output inductor 30, and output capacitor 40) that are externally connected to the semiconductor device 10. The switching power source apparatus 1 uses switching output stages (in the example of the present figure, an output transistor 11H and a synchronization rectification transistor 11L that are integrated in the semiconductor device 10) to step down a power source voltage Vcc and thereby generates a desired output voltage Vo.

The semiconductor device 10 is an IC or an LSI that functions as a part of the switching power source device 1, and includes the output transistor 11H, the synchronization rectification transistor 11L, an upper side driver 12H, and a lower side driver 12L. In the meantime, also the semiconductor device 10 integrates a not-shown control circuit and a trouble protection circuit.

Besides, the semiconductor device 10 has a plurality of external terminals (in the example of the present figure, a switch terminal T10, a power source terminal T11, and a ground terminal T12) as devices for securing electrical connection with an outside of the device. The switch terminal T10 is an external terminal for externally connecting a switch line 70. The power source terminal T11 is an external terminal for externally connecting a power source line 50. The ground terminal T12 is an external terminal for externally connecting a ground line 60.

The output transistor 11H is a PMOSFET [P channel type metal oxide semiconductor field effect transistor] that functions as an upper side switch of a switching output stage. A source and back gate of the output transistor 11H are internally connected to the power source terminal T11. A drain of the output transistor 11H is internally connected to the switch terminal T10. A gate of the output transistor 11H is connected to an application terminal (output terminal of the upper side driver 12H) for an upper side gate signal GH. The output transistor 11H is turned off when the upper side gate signal GH is at a high level, and is turned on when the upper side gate signal GH is at a low level.

The synchronization rectification transistor 11L is an NMOSFET [N channel type MOSFET] that functions as a lower side switch of the switching output stage. A source and back gate of the synchronization rectification transistor 11L are internally connected to the ground terminal T12. A drain of the synchronization rectification transistor 11L is internally connected to the switch terminal T10. A gate of the synchronization rectification transistor 11L is connected to an application terminal (output terminal of the lower side driver 12L) for a lower side gate signal GL. The synchronization rectification transistor 11L is turned on when the lower side gate signal GL is at a high level, and is turned off when the lower side gate signal GL is at a low level.

In the switching output stage, the output transistor 11H and the synchronization rectification transistor 11L are turned on/off complementarily. By such an on/off operation, a rectangular waveform switch voltage Vsw, which undergoes a pulse drive between the power source voltage and a ground voltage GND, is generated at the switch terminal T10. In the meantime, the term "complementarily" in the present specification covers not only a case where the on/off states of the output transistor 11H and synchronization rectification transistor 11L are completely reverse but also a case where a concurrent off-period (dead time) of both transistors is set.

Besides, in the switching output stage, the above synchronization rectification system is not limiting, and a diode rectification system using a rectification diode may be employed in place of the synchronization rectification transistor 11L.

Besides, it is also possible not to integrate the switching output stage into the semiconductor device 10 but to externally connect the switching output stage to the semiconductor device 10. In this case, an upper side gate terminal and a lower side gate terminal are required in place of the switch terminal T10.

The upper side driver 12H is connected between the power source terminal T11 and the ground terminal T12, and generates the upper side gate signal G11 in accordance with an upper side driver control signal input from a not-shown control circuit.

The lower side driver 12L is connected between the power source terminal T11 and the ground terminal T12, and generates the lower side gate signal GL in accordance with a lower side driver control signal input from a not-shown control circuit.

In, the meantime, parasitic resistance components 13a and 13b reside respectively in an internal wiring that connects the upper side driver 12H and the ground terminal T12 to each other and in an internal wiring that connects the lower side driver 12L and the power source terminal T11 to each other. Besides, parasitic inductance components 14x to 14z reside respectively in the power source terminal T11, the switch terminal T10, and the ground terminal T12.

The bypass capacitor 20 is a device for curbing a power source fluctuation of the semiconductor device 10 and connected between the power source line 50 and the ground line 60. In the meantime, the bypass capacitor 20 includes an equivalent series resistance component 22 and an equivalent series inductance component 23 besides a capacitance component 21. As the bypass capacitor 30 it is desirable to use a laminated ceramic capacitor or the like that has a small device size, small equivalent series resistance component 22, small equivalent series inductance component 23, and a wide operation temperature range.

The output inductor 30 and output capacitor 40 form an LC filter that rectifies and smooths the switch voltage Vsw to generate the output voltage Vo. Both a second terminal of the output inductor 30 and a first terminal of the output capacitor 40 are connected to an output line 80. A second terminal of the output capacitor 40 is connected to the ground line 60. In the meantime, the output, inductor 30 includes an equivalent series resistance component 32 besides an inductance component 31. Besides, the output capacitor 40 includes an equivalent series resistance component 42, an equivalent series inductance component 43 besides a capacitance component 41.

The power source line 50 is a printed wiring that electrically connects an application terminal for the power source voltage Vo and the power source terminal T11 to each other. A parasitic inductance component 51 and a parasitic resistance component 52 reside in the power source line 50.

The ground line 60 is a printed wiring that electrically connects the ground terminal (application terminal for the ground voltage GND) and the ground terminal T12 to each other. A parasitic inductance component 61 and a parasitic resistance component 62 reside in the ground line 60.

The switch line 70 is a printed wiring that electrically connects the first terminal of the output inductor 30 and the switch terminal T10 to each other. A parasitic inductance component 61 and a parasitic resistance component 62 reside in the ground line 60.

The output line 80 is a printed wiring that electrically connects the second terminal of the output inductor 30, the first terminal of the output capacitor 40, and the output terminal for the output voltage Vo to one mother. Like the other printed wirings, a parasitic inductance component and a parasitic resistance component reside in the output line 80. However, in the present figure, for the sake of easy drawing, they are not illustrated.

Figure 2:
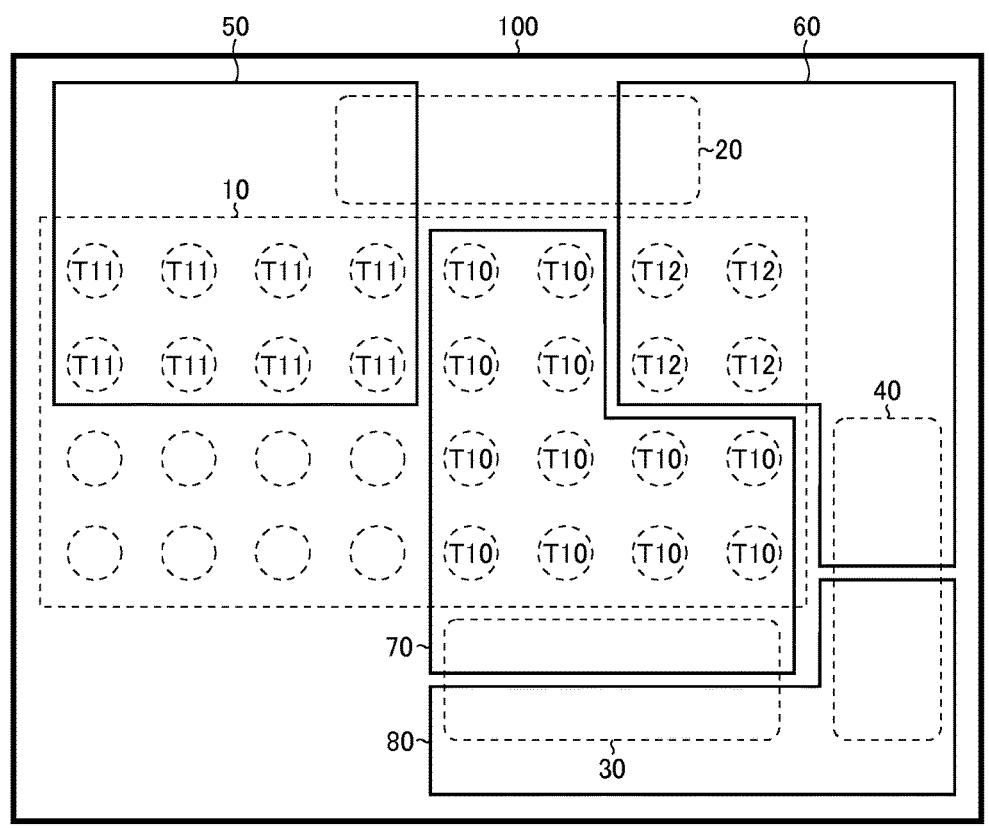
FIG. 2 is a see-through top view showing a wiring layout of the first embodiment.

FIG. 2 is a see-through top view showing a wiring layout of the first embodiment. In the example of the present figure, the power source line 50, ground line 60, switch line 70, and output line 80, which are patterned on a printed wiring board 100, are all illustrated by solid lines. On the other hand, the semiconductor device 10, the bypass capacitor 20, the output inductor 30, and the output capacitor 40 are all illustrated by broken lines in a see-through manner.

A plurality of external terminals are arranged in an array shape on a bottom surface of the semiconductor device 10. The switch terminal T10, the power source terminal T11, and the ground terminal T12 are each disposed a plurality of ones (in the example of the present figure, twelve switch terminals T10, eight power source terminals T11, and four ground terminals T12), and each is connected in common in the semiconductor device 10. By employing such a structure, it is possible to reduce the parasitic inductance components 14x to 14z residing in the respective terminals and the parasitic resistance components 52 to 72 residing in bonding portions between the respective terminals and the printed wiring board 100. Accordingly, it becomes possible to contribute to curbing of the power source fluctuation.

Besides, the power source line 50, the ground line 60, and the switch line 70 are all patterned as thick and short as possible. By employing such a structure, it is possible to reduce the parasitic elements (parasitic inductance components 51 to 71 and parasitic resistance components 52 to 72) residing in the respective lines. Accordingly, it becomes possible to contribute to the curbing of the power source fluctuation.

Besides, the bypass capacitor 20 is disposed very near the semiconductor device 10 (very near the power source terminal T11 and the ground terminal T12). By employing such a structure, the bypass capacitor is almost immune from influence of the parasitic elements (parasitic inductance components 51 to 61 and parasitic resistance components 52 to 62) residing in the power source line 50 and the ground line 60. Accordingly, it becomes possible to contribute to the curbing of the power source fluctuation.

As describe above, in the switching power source device 1 of the first embodiment, by employing the parallel arrangement of the external terminals, the thick and short wiring pattern, the very near connection of the semiconductor device 10 and the bypass capacitor 20, the influence of the parasitic elements is made as small as possible to curb the power source fluctuation.

Besides, the power source line 50 and the ground line 60 are separately disposed to interpose the switch line 70. By employing such a structure, the power source line 50 and the ground line 60 become unlikely to directly short to each other. Accordingly, it becomes possible to raise safety.

Second Embodiment

Figure 3:
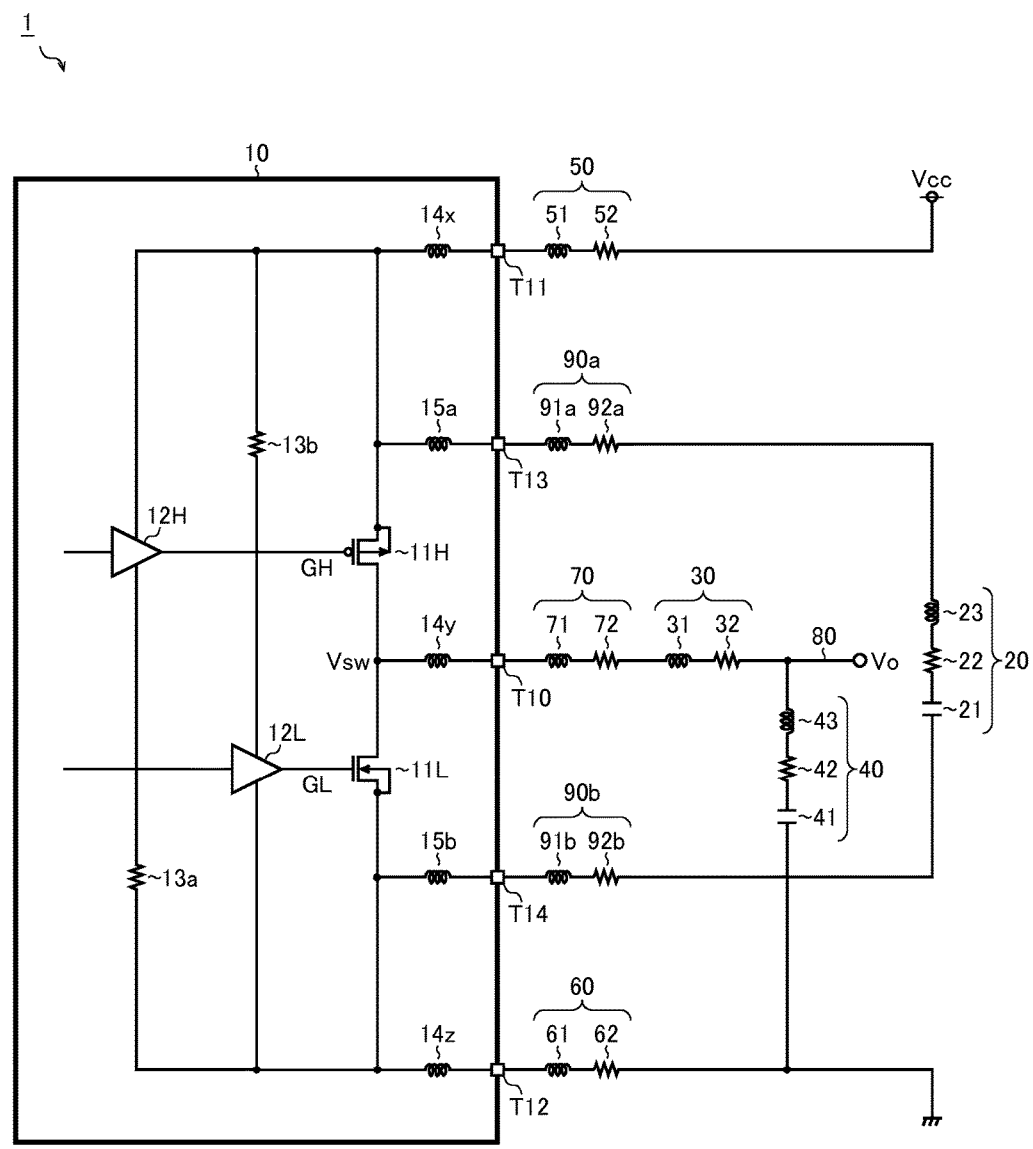
FIG. 3 is a circuit diagram showing a second embodiment of a switching power source device.

FIG. 3 is a circuit diagram showing a second embodiment of the switching power source device. The switching power source device 1 of the present embodiment has the substantially same structure as the above first embodiment (FIG. 1), and has a feature that the semiconductor device 10 is provided with capacitor connection terminals T13 and T14. Because of this, the same components as the first embodiment are indicated by the same reference numbers to skip double description, and hereinafter, feature points of the second embodiment are described in a focused manner.

The capacitor connection terminal T13 is an external terminal for externally connecting a first terminal of the bypass capacitor 20. The capacitor connection terminal T13 is internally connected to the power source terminal T11. A parasitic inductance component 15a resides in the capacitor connection terminal T13.

The capacitor connection terminal T14 is an external terminal for externally connecting a second terminal of the bypass capacitor 20. The capacitor connection terminal T14 is internally connected to the ground terminal T12. A parasitic inductance component 15b resides in the capacitor connection terminal T14.

A capacitor connection line 90a is a printed wiring that electrically connects the first terminal of the bypass capacitor 20 and the capacitor connection terminal T13 to each other. A parasitic inductance component 91a and a parasitic resistance component 92a reside in the capacitor connection line 90a.

A capacitor connection line 90b is a printed wiring that electrically connects the second terminal of the bypass capacitor 20 and the capacitor connection terminal T14 to each other. A parasitic inductance component 91b and a parasitic resistance component 92b reside in the capacitor connection line 90b.

In a case where a large current flows in the power source line 50 and the ground line 60, the influence of the parasitic elements (parasitic inductance components 51 to 61 and parasitic resistance components 52 to 62) residing in the respective lines becomes prevailing, and even if the structure of the first embodiment is employed, there is still a risk that the power source fluctuation of the semiconductor device 10 could not be sufficiently curbed.

On the other hand, in the second embodiment, besides the power source terminal T11 and the ground terminal T12, the dedicated capacitor connection terminals T13 and T14 are disposed. By employing such a structure, it is possible to neglect a large current route in which the influence of the parasitic elements becomes prevailing and to externally connect the bypass capacitor 20. Accordingly, it becomes possible to more effectively curb the power source fluctuation of the semiconductor device 10. Especially in an application that operates on a low voltage and handles a large current, there is a risk that the semiconductor device 10 would have trouble in the operation because of a slight power source fluctuation. Accordingly, it can be said desirable to employ the structure of the second embodiment.

Figure 4:
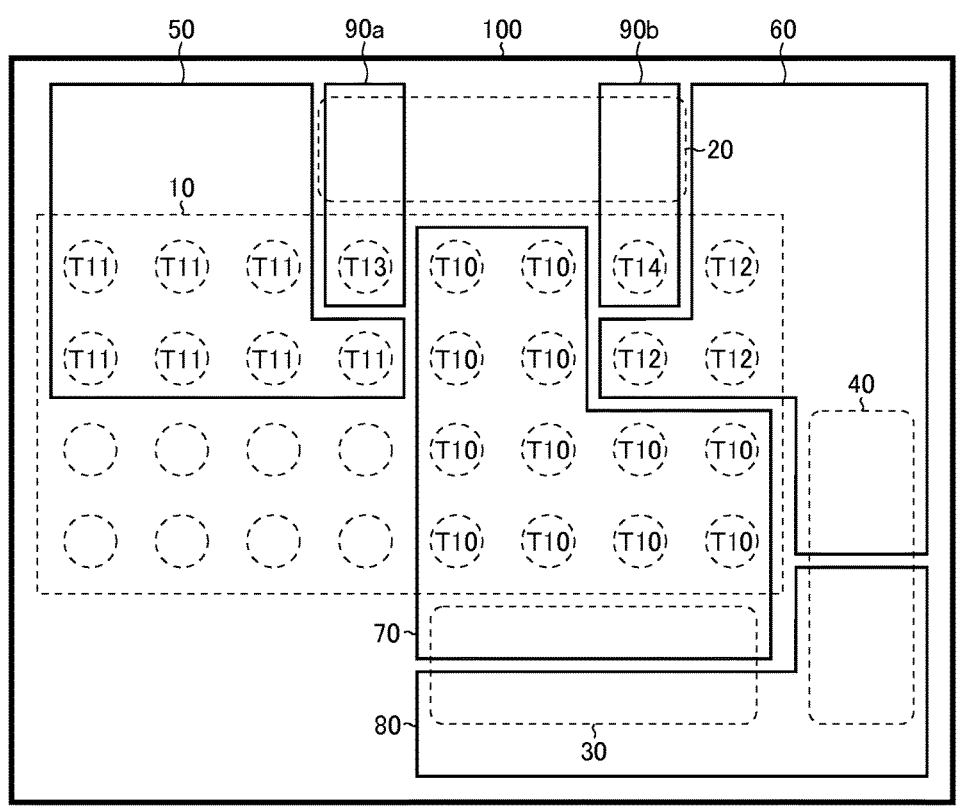
FIG. 4 is a see-through top view showing a wiring layout of the second embodiment.

FIG. 4 is a see-through top view showing a wiring layout of the second embodiment. In the example of the present figure, the capacitor connection terminals T13 and T14 are each disposed one, and the bypass capacitor 20 is disposed very near the capacitor connection terminals T13 and T14. By employing such a structure, the bypass capacitor is almost immune from influence of the parasitic elements (parasitic inductance components 91a to 91b and parasitic resistance components 92a to 92b) residing in the capacitor connection lines 90a and 90b. Accordingly, it becomes possible to contribute to the curbing of the power source fluctuation.

Figure 5:
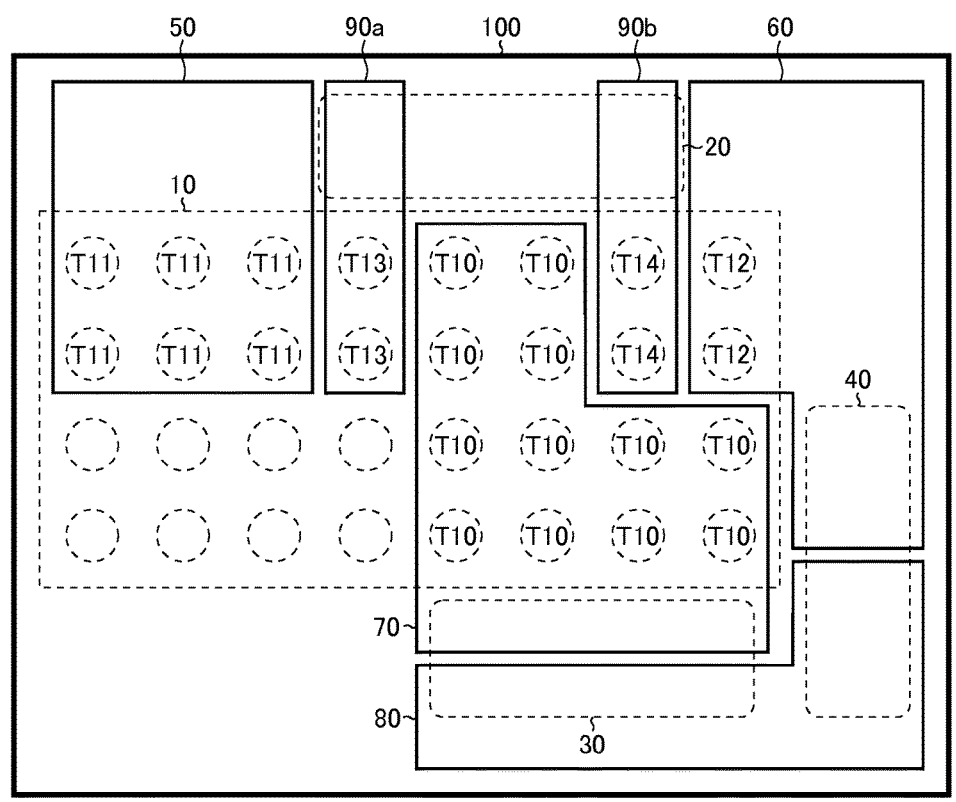
FIG. 5 is a see-through top view showing a modification of a wiring layout.

FIG. 5 is a see-through top view showing a modification of the wiring layout. In the modification of the present figure, the capacitor connection terminals T13 and T14 are each disposed a plurality of ones, and the respective terminals are connected in common in the semiconductor device 10. By employing such a structure, it is possible to reduce the parasitic inductance components 15a to 15b residing in the respective terminals and the parasitic resistance components 92a to 92b residing in portions bonded to the printed wiring board 100. Accordingly, it becomes possible to achieve further curbing of the power source fluctuation.

In the meantime, in a case where the present modification is employed, it is desirable to effectively use a limited number of external terminals by decreasing the parallel number of the power source terminals T10 and ground terminals T10 in such a way that the number of external terminals of the semiconductor device 10 does not increase too much.

<IC Package>

Figure 6A:
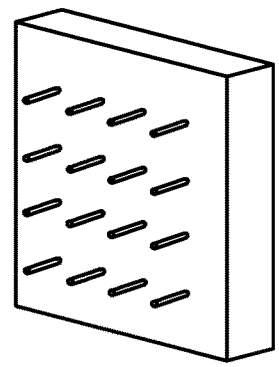
FIG. 6A is a view showing a variation (PGA) of an IC package.
Figure 6B:
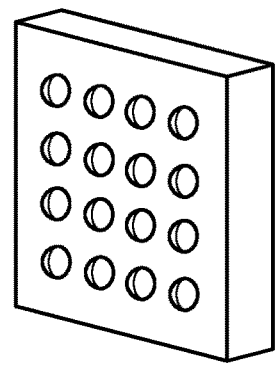
FIG. 6B is a view showing a variation (BGA) of an IC package.
Figure 6C:
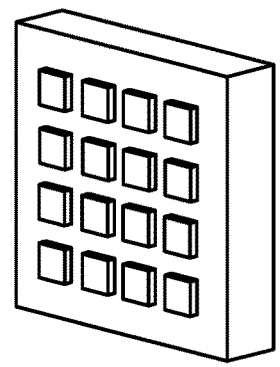
FIG. 6C is a view showing a variation (LGA) of an IC package.

FIG. 6A to FIG. 6C are each a view showing a variation of an IC package.

FIG. 6A illustrates a PGA [pin grid array] package. In a case where the semiconductor device 10 is disposed in the PGA package. Pins are used as the external terminals (switch terminal T10, power source terminal T11, ground terminal T12, capacitor connection terminals T13 and T14 and the like) of the semiconductor device 10, and the respective pins are arranged in an array shape on a bottom surface of the package.

FIG. 6B illustrates a BGA [ball grid array] package. In a case where the semiconductor device 10 is disposed in the BGA package. Solder balls are used as the external terminals of the semiconductor device 10, and the respective solder balls are arranged in an array shape on a bottom surface of the package.

FIG. 6C illustrates a LGA [land grid array] package. In a case where the semiconductor device 10 is disposed in the LGA package. Electrode pads are used as the external terminals of the semiconductor device 10, and the respective electrode pads are arranged in an array shape on a bottom surface of the package.

In the meantime, the introduction target of the capacitor connection terminals T13 and T14 is not limited to the above IC packages, and it is also possible to introduce the terminals into IC packages other than the above packages such as a SOP [small outline package], a QFP [quad flat package] and the like.

<Examples of Application to Electronic Apparatuses>

Figure 7A:
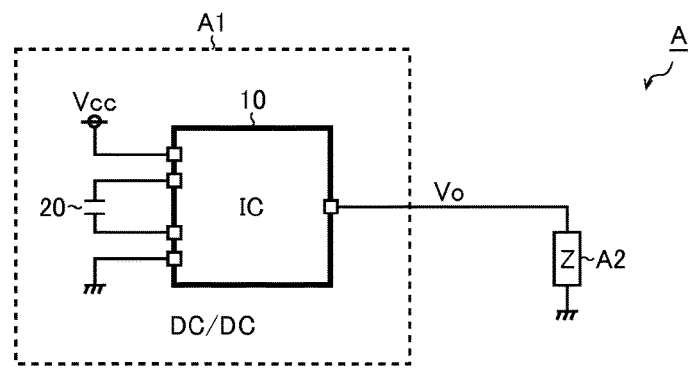
FIG. 7A is a view showing a variation (switching power source device) of an electronic apparatus.
Figure 7B:
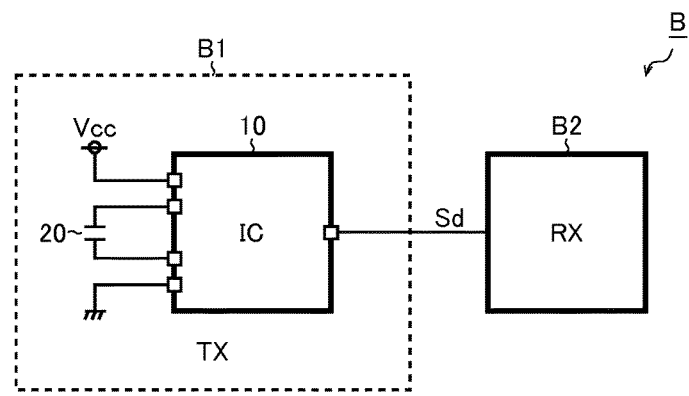
FIG. 7B is a view showing a variation (transmission device) of an electronic apparatus.
Figure 7C:
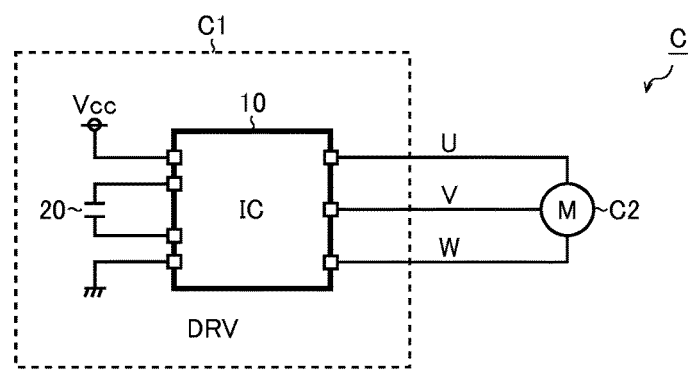
FIG. 7C is a view showing a variation (motor drive device) of an electronic apparatus.

FIG. 7A to FIG. 7C are each a view showing a variation of an electronic apparatus that has the semiconductor device 10 and the bypass capacitor 20.

An electronic apparatus A of FIG. 7A has: a switching power source device A1 that generates the desired output voltage Vo from the power source voltage Vcc by using a switching output stage which is integrated in or externally connected to the semiconductor device 10; and a load A2 that is supplied with the output voltage Vo to operate. In the meantime, the semiconductor device 10 and the bypass capacitor 20 function as a part of the switching power source device A1. As described above, it can be said that the electronic apparatus A is an application example similar to the above first embodiment (FIG. 1 and FIG. 2) and the second embodiment (FIG. 3 to FIG. 5).

An electronic apparatus B of FIG. 7B has: a transmission device B1 that transmits a digital signal Sd by using the switching output stage which is integrated in or externally connected to the semiconductor device 10; and a reception device B2 that receives the digital signal Sd. In the meantime, the semiconductor device 10 and the bypass capacitor 20 function as a part of the transmission device B1.

An electronic apparatus C of FIG. 7C has: a motor drive device C1 that generates motor drive signals U, V, and W by using the switching output stage which is integrated in or externally connected to the semiconductor device 10; and a motor C2 that is supplied with the motor drive signals U, V, and W to rotate. In the meantime, the semiconductor device 10 and the bypass capacitor 20 function as a part of the motor drive device C1.

As described above, the semiconductor device 10 is applicable to various kinds of applications.

Figure 8:
FIG. 8 is an appearance view of a smart phone.

FIG. 8 is an appearance view of a smart phone. A smart phone X is an example of the electronic apparatus A shown in FIG. 7A, and can preferably incorporate the switching power source device A1 that uses the semiconductor device 10 and the bypass capacitor 20.

<Summarization>

The embodiments described hereinbefore are summarized.

The semiconductor device disclosed in the present specification has a structure (first structure) that includes: a first terminal that is to be externally connected to a power source line; a second terminal that is to be externally connected to a ground line; a third terminal that is internally connected to the first terminal and to be externally connected to a first terminal of a bypass capacitor; and a fourth terminal that is internally connected to the second terminal and to be externally connected to a second terminal of the bypass capacitor.

In the meantime, in the semiconductor device having the first structure, a structure (second structure) may be employed, in which the first terminal and the second terminal are each disposed a plurality of ones.

Besides, in the semiconductor device having the first or second structure, a structure (third structure) may be employed, in which the third terminal and the fourth terminal are each disposed one.

Besides, in the semiconductor device having the first or second structure, a structure (fourth structure) may be employed, in which the third terminal and the fourth terminal are each disposed a plurality of ones.

Besides, in the semiconductor device having any one of the first to fourth structures, a structure (fifth structure) may be employed, in which the first terminal to the fourth terminal are each a pin, a solder ball, or an electrode pad, and arranged in an array shape on a bottom surface of a package.

Besides, the electronic apparatus disclosed in the present specification has a structure (sixth structure) that includes: the semiconductor device having any one of the first to fifth structures, and a bypass capacitor that is externally connected to the semiconductor device.

In the meantime, in the electronic apparatus having the sixth structure, a structure (seventh structure) may be employed, in which the bypass capacitor is disposed very near the third terminal and the fourth terminal.

Besides, in the electronic apparatus having the sixth or seventh structure, a structure (eighth structure) may be employed, in which the semiconductor device functions as a part of a power source device that generates a desired output voltage by using a switching output stage which is connected between the first terminal and the second terminal.

Besides, in the electronic apparatus having the sixth or seventh structure, a structure (ninth structure) may be employed, in which the semiconductor device functions as a part of a transmission device that transmits a digital signal by using a switching output stage which is connected between the first terminal and the second terminal.

Besides, in the electronic apparatus having the sixth or seventh structure, a structure (tenth structure) may be employed, in which the semiconductor device functions as a part of a motor drive device that drives a motor by using a switching output stage which is connected between the first terminal and the second terminal.

According to the invention disclosed in the present specification, it becomes possible to provide a semiconductor device capable of effectively curbing a power source fluctuation and an electronic apparatus that uses the semiconductor device.

<Other Modifications>

As described above, the various technical features disclosed in the present specification are able to be modified without departing from the spirit of the technical creation besides the above embodiments. In other words, it should be considered that the above embodiments are examples in all respects and are not limiting, and it should be understood that the technical scope of the present invention is not indicated by the above description of the embodiments but by the claims, and all modifications within the scope of the claims and the meaning equivalent to the claims are covered.

INDUSTRIAL APPLICABILITY

The invention disclosed in the present specification is preferably applicable to a semiconductor device, which operates on a low voltage and handles a large current, as a device that curbs a power source fluctuation.

What is claimed is:

1. A semiconductor device comprising:
   a plurality of first external terminals configured to be externally connected to a power source line,
   a plurality of second external terminals configured to be externally connected to a ground line,
   a third external terminal internally connected to the plurality of first external terminals and configured to be externally connected to a first terminal of a bypass capacitor,
   a fourth external terminal internally connected to the plurality of second external terminals and configured to be externally connected to a second terminal of the bypass capacitor, and
   a plurality of fifth external terminals,
   a package,
   a first transistor in the package and configured to be internally connected between the plurality of first external terminals and the plurality of fifth external terminals, wherein a source of the first transistor is connected to the plurality of first external terminals, a drain of the first transistor is connected to the plurality of fifth external terminals, and a gate of the first transistor is arranged to receive a first gate signal, a second transistor in the package and configured to be internally connected between the plurality of second external terminals and the plurality of fifth external terminals, wherein a source of the second transistor is connected to the plurality of second external terminals, a drain of the second transistor is connected to the plurality of fifth external terminals, and a gate of the second transistor is arranged to receive a second gate signal, wherein the plurality of first external terminals, the plurality of second external terminals, the third external terminal, the fourth external terminal, and the plurality of fifth external terminals are arranged in an array shape on a bottom surface of the package, at least a part of the plurality of fifth external terminals is disposed between the plurality of first external terminals and the plurality of second external terminals on a surface of the semiconductor device, the third external terminal is disposed between at least a part of the plurality of first external terminals and at least a part of the plurality of fifth external terminals, and the fourth external terminal is disposed between at least a part of the plurality of second external terminals and at least a part of the plurality of fifth external terminals.

2. The semiconductor device according to claim 1, wherein the third external terminal is a single terminal and the fourth external terminal is a single terminal.

3. The semiconductor device according to claim 1 comprising a plurality of the third external terminals and a plurality of the external fourth terminals.

4. The semiconductor device according to claim 1, wherein each of the plurality of first external terminals, each of the plurality of second external terminals, the third external terminal, the fourth external terminal and each of the plurality of fifth external terminals is a pin, a solder ball, or an electrode pad.

5. An electronic apparatus comprising: the semiconductor device according to claim 1, and the bypass capacitor that is externally connected to the third and fourth terminals.

6. The semiconductor device according to claim 1, wherein a length of wiring between the first external terminal and the first transistor is longer than a length of wiring between the third external terminal and the first transistor, and a length of wiring between the second external terminal and the second transistor is longer than a length of wiring between the fourth external terminal and the second transistor.

7. The semiconductor device according to claim 1, wherein a part of the plurality of fifth external terminals is disposed between the plurality of first external terminals and the plurality of second external terminals on the surface of the semiconductor device, and another part of the plurality of fifth external terminals is not disposed between the plurality of first external terminals and the plurality of second external terminals on the surface of the semiconductor device.

8. The semiconductor device according to claim 1, the number of the plurality of first external terminals is more than the number of the plurality of second external terminals.

9. The semiconductor device according to claim 3, the number of the plurality of fourth external terminals is the same as the number of the plurality of second external terminals.

10. The electronic apparatus according to claim 5, wherein the first transistor and the second transistor constitute a switching output stage, the semiconductor device functions as a part of a power source device that generates a desired output voltage by using the switching output stage.

11. The electronic apparatus according to claim 5, wherein the first transistor and the second transistor constitute a switching output stage, the semiconductor device functions as a part of a transmission device that transmits a digital signal by using the switching output stage.

12. The electronic apparatus according to claim 5, wherein the first transistor and the second transistor constitute a switching output stage, the semiconductor device functions as a part of a motor drive device that drives a motor by using the switching output stage.

13. The electronic apparatus according to claim 5, further comprising an output inductor that is externally connected to the plurality of fifth external terminals, wherein at least a part of the plurality of fifth terminals is disposed between the bypass capacitor and the output inductor.

14. The electronic apparatus according to claim 5, wherein the bypass capacitor is arranged along the third external terminal and the fourth external terminal.

15. The electronic apparatus according to claim 5, further comprising an output capacitor that is externally connected between the plurality of second external terminals and the plurality of fifth external terminals.

16. The semiconductor device according to claim 7, wherein at least a part of the plurality of second external terminals is disposed between the fourth external terminal and a part of the plurality of fifth external terminals.

17. The electronic apparatus according to claim 15, wherein the output capacitor is arranged along a part of the plurality of the second external terminals and a part of the plurality of the fifth external terminals.

* * * * *